United States Patent
Gillin et al.

(10) Patent No.: US 9,837,794 B2
(45) Date of Patent: Dec. 5, 2017

(54) OPTOELECTRONIC DEVICES, METHODS OF FABRICATION THEREOF AND MATERIALS THEREFOR

(71) Applicant: Queen Mary & Westfield College, University of London, London (GB)

(72) Inventors: William Gillin, London (GB); Peter Wyatt, London (GB); Ignacio Hernandez, Santander (ES)

(73) Assignee: Queen Mary & Westfield College, University of London (GB)

(*) Notice: Subject to any disclaimer, the term of this patent is extended or adjusted under 35 U.S.C. 154(b) by 0 days.

(21) Appl. No.: 14/902,104

(22) PCT Filed: Jul. 2, 2014

(86) PCT No.: PCT/GB2014/052011
§ 371 (c)(1),
(2) Date: Dec. 30, 2015

(87) PCT Pub. No.: WO2015/001338
PCT Pub. Date: Jan. 8, 2015

(65) Prior Publication Data
US 2016/0141838 A1    May 19, 2016

(30) Foreign Application Priority Data

Jul. 2, 2013    (GB) .................................. 1311862.5

(51) Int. Cl.
*H01S 5/36*     (2006.01)
*H01L 51/50*    (2006.01)
(Continued)

(52) U.S. Cl.
CPC ............ *H01S 5/36* (2013.01); *H01L 51/0089* (2013.01); *H01L 51/0092* (2013.01);
(Continued)

(58) Field of Classification Search
CPC ... H01S 5/36; H01L 51/0089; H01L 51/0092; H01L 51/5016; H01L 51/5028
See application file for complete search history.

(56) References Cited

U.S. PATENT DOCUMENTS

2002/0076576 A1* 6/2002 Li ...................... H01L 51/0038
                                                       428/690
2002/0197050 A1* 12/2002 Schanze ................. C09K 11/06
                                                       385/143
(Continued)

FOREIGN PATENT DOCUMENTS

CN            1480012 A    3/2004

OTHER PUBLICATIONS

Wang et al. "Enhanced Luminescence of an Erbium (III) Ion-Association Ternary Complex with a Near-Infrared Dye", Journal of Physical Chemistry B, vo. 108, pp. 8084-8088 (2004).*
(Continued)

*Primary Examiner* — Eric Bolda
(74) *Attorney, Agent, or Firm* — Kelley Drye & Warren LLP

(57) ABSTRACT

An optoelectronic signal translating device having a region containing rare earth or transition metal ions for generation of radiation of a predetermined wavelength. Said region includes an organic complex comprising a ligand adapted to enhance the emission of radiation and a chromophore separately co-operable with a radiation source of wavelength not greater than that of said predetermined desired radiation. Said chromophore can be excited to cross-couple with the upper permitted energy state of said rare earth or transition metal ions, thereby generating said predetermined desired radiation by subsequent decay of said ions to the permitted lower energy state.

16 Claims, 9 Drawing Sheets

(51) Int. Cl.
    *H01S 3/16*     (2006.01)
    *H01L 51/00*     (2006.01)
    *H01S 5/50*     (2006.01)
    *H01S 3/063*     (2006.01)
    *H01S 3/23*     (2006.01)

(52) U.S. Cl.
    CPC ........ *H01S 5/5054* (2013.01); *H01L 51/5016* (2013.01); *H01L 51/5028* (2013.01); *H01S 3/0632* (2013.01); *H01S 3/163* (2013.01); *H01S 3/1608* (2013.01); *H01S 3/2308* (2013.01)

(56) References Cited

U.S. PATENT DOCUMENTS

| | | | | |
|---|---|---|---|---|
| 2005/0056856 A1* | 3/2005 | Yamazaki | ............... | H01S 5/423 257/98 |
| 2005/0058162 A1* | 3/2005 | Nomura | ............... | H01S 5/0425 372/9 |
| 2005/0069012 A1* | 3/2005 | Shimomura | ........ | H01S 5/02212 372/87 |

OTHER PUBLICATIONS

Tan "Synthesis and characterization of perfluorinated lanthanide complexes for near-infrared applications", Ph. D. thesis, University of London, 2009.*
Chinese Office Action and Search Report dated Nov. 23, 2016.

* cited by examiner

OPTOELECTRONIC DEVICES, METHODS OF FABRICATION THEREOF AND MATERIALS THEREFOR

This application is a national stage application under 35 U.S.C. 371 claiming benefit of PCT application PCT/GB2014/052011, filed Jul. 2, 2014, which claims benefit of United Kingdom application no. 1311862.5, filed Jul. 2, 2013, both of which applications are incorporated by reference herein in their entireties.

This invention relates to optoelectronic devices, to methods of fabrication of such devices, to signal translating systems incorporating these devices and to materials for use therein.

According to Bohr's quantum mechanical model, an atom may only exist in certain permitted energy states. The application of this theory to optoelectronic devices is set out in *Chapter 2 of Fibre Optic Lasers and Amplifiers* edited by P. W. France (France 1991) and *Rare Earth Doped Fiber Lasers and Amplifiers* edited by Michel Digonnet (Digonnet 1993). Table 1 (p 20) of Digonnet 1993 and FIG. 2.3 (p 20) of France 1991 illustrate the permitted energy transitions for various dopants in different glass hosts.

PCT patent application WO8701246A1 discloses single-mode fibre lasers and amplifiers which possess a number of advantages over their bulk counterparts. By virtue of their small cores (typically 8 µm diameter and less), very low thresholds (~1000 µW) and high gains can be achieved. Also since typically fibre diameters overall are about 100 µm, thermal effects prove to be minimal.

As a result of these attributes, useful laser action or amplifier gain can be produced for less commonplace rare-earth or transition metal dopants and for less commonplace optical transitions, even where the optical transitions involved are inherently weak. Room temperature continuous laser operation has even been found possible for 3-level laser systems which had previously only operated in a pulsed mode.

Since the dopant concentration is so low, manufacture can be economical. A typical device might use as little as 0.1 µg of dopant oxide.

Silica, if selected as the host medium, has good power handling characteristics. Moreover in the presence of a high-silica glass host, the optical transitions of the rare-earth or transition metal dopant ions are substantially broadened. This permits the realisation of both tunable lasers and broad-band amplifiers.

Most rare-earth dopants and some transition metal dopants have now been investigated experimentally. Remarkably, all exhibit windows in which losses are low notwithstanding the close proximity of high-loss absorption bands. This enables the construction of extremely long amplifiers and lasers.

In summary, the active devices provide improved sources/amplifiers for telecommunications applications because they can handle high powers without damage, they provide smaller/lighter/cheaper general purpose active devices and may in conjunction with other fibre devices (eg gratings) provide new and powerful signal processing functions. Note also that non-linear effects can be readily achieved at the optical power levels obtained in fibre lasers, affording exploitation of a number of simultaneous laser and nonlinear effects. However, it is not feasible to increase the radiation yield indefinitely by increasing dopant concentrations because at high concentrations the close proximity of neighbouring ions causes losses, a phenomenon known as concentration quenching. In order to achieve optimum performance of fibre rare-earth doped lasers and amplifiers it was necessary to fabricate them from preforms prepared by a modified chemical vapour deposition process which gave a low concentration of the dopant. A similar effect may be achieved by incorporating the dopant into an organic ligand.

Modern telecommunications are based on a worldwide network of silica fibre-optic cables which encircle the globe carrying data at the speed of light. Despite the low losses experienced in these fibres it is still necessary to amplify the optical signals regularly and this has hitherto been performed by means of erbium doped fibre amplifiers (EDFAs). These rely on an intra-atomic transition in the erbium ion that emits at a wavelength of 1.5 µm, the low loss window of silica fibres. Due to the weak excitation properties of erbium ions, a separate pump laser must be launched axially down erbium doped fibres of 10-30 m length to achieve sufficient population inversion and thus optical gain. The properties of erbium-based amplifiers can, in principle, be enhanced by incorporating erbium ions into organic hosts containing chromophores that couple to the erbium (this phenomenon is called sensitisation), which allows for pumping with lower intensity sources, such as light emitting diodes (LEDs) and amplification in much shorter lengths. Attempts to implement this idea have been hampered by the quenching of the erbium ions by CH or OH oscillators present in most organic compounds. We have found that we can couple the long fluorescence lifetimes of erbium in a halogenated organic ligand with a fully halogenated chromophore to produce a system with exceptional sensitisation ($>10^4$ relative to direct absorption) coupled with an internal quantum efficiency of ~7%. This system has been implemented into planar amplifying waveguides of the type described in our patent application WO0178203A1 (the contents of which are imported by reference) to produce optical amplifiers and lasers operating at the important 1.5 µm telecommunication wavelength. This approach allows for the development of a variety of structures which can then be integrated onto any flat substrate and, for example, integration onto silicon allows for optical functionality to be added to silicon devices.

Despite over 10 years of work on organic erbium complexes there has hitherto been remarkably little progress in making systems with sufficiently promising properties to be considered for use in optical amplifiers or lasers. Although on the one hand, some organic chromophores have been shown to sensitise the erbium in suitable spectral ranges and, on the other hand some deuterated and halogenated (even perfluorinated) complexes show a considerable enhancement of the erbium emission properties and provide relatively long lifetimes, the reality is that both conditions are never fulfilled to an operational extent. One of the problems with producing perfluorinated ligands and chromophores is that the strongly electron withdrawing properties of the fluorine atoms makes it difficult for the ligands to bind with lanthanide ions and many of the compounds are not chemically or thermally stable. Apart from the synthesis-related problems, this represents an extra difficulty towards processing the materials via a conventional organic vapour deposition technique, which has been employed to achieve the purity and optical quality required for signal translating applications.

We have overcome these problems by separating the chromophore function (strong absorption in the organic group) from that of producing a high efficiency organic environment for the erbium ion (strong, long lived 1.5 µm emission) whilst creating a highly efficient energy transfer between the two.

According to the present invention there is provided an optoelectronic signal translating device having a region containing rare earth or transition metal ions with permitted upper and lower energy states for generation of radiation of a predetermined wavelength by means of a transition between said energy states wherein said region includes an organic complex comprising a ligand adapted to enhance the emission of radiation by conservation of ions in said upper energy state and a chromophore separately co-operable with a radiation source of wavelength not greater than that of said predetermined desired radiation to excite said chromophore to cross-couple with either the upper permitted energy state or to a higher energy state of said rare earth or transition metal ions from which said ions decay to said upper permitted state thereby to generate said predetermined desired radiation by the subsequent decay of said ions to the permitted lower energy state.

The invention will be particularly described with reference to the accompanying drawings in which:—

Figure 8:
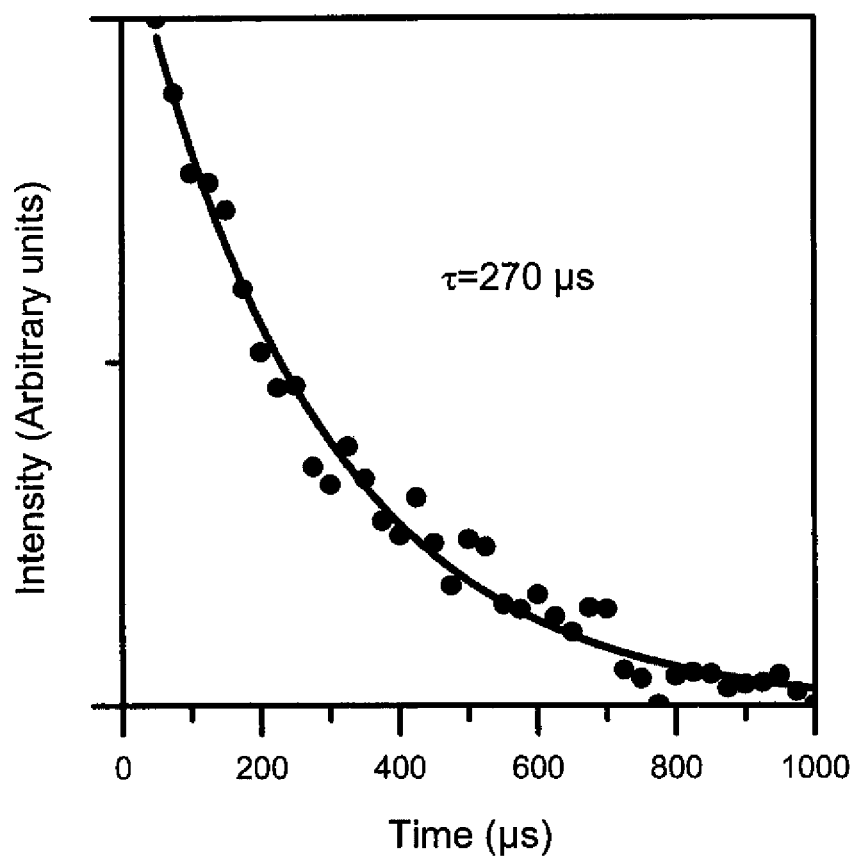
Figure 9:
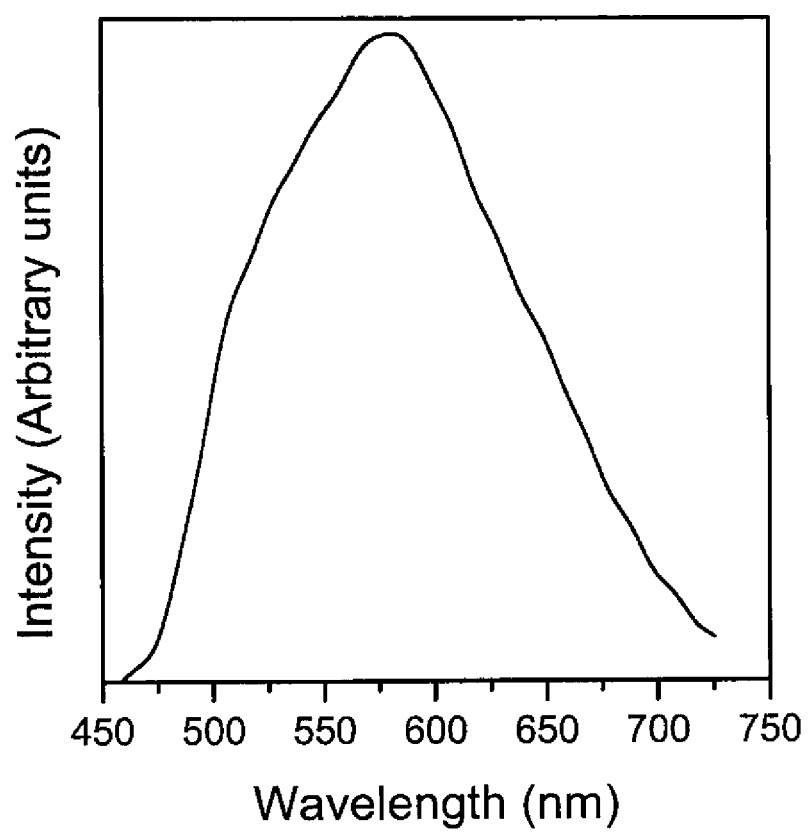

FIG. 8 shows the photoluminescence decay of the triplet emission in $Zn(F-BTZ)_2$. FIG. 9 shows the delayed ($\Delta t=50$ µs) photoluminescence emission of $Zn(F-BTZ)_2$. The spectrum shows the triplet emission, which matches the broad low energy band observed in electroluminescence (see main text).

Figure 10:
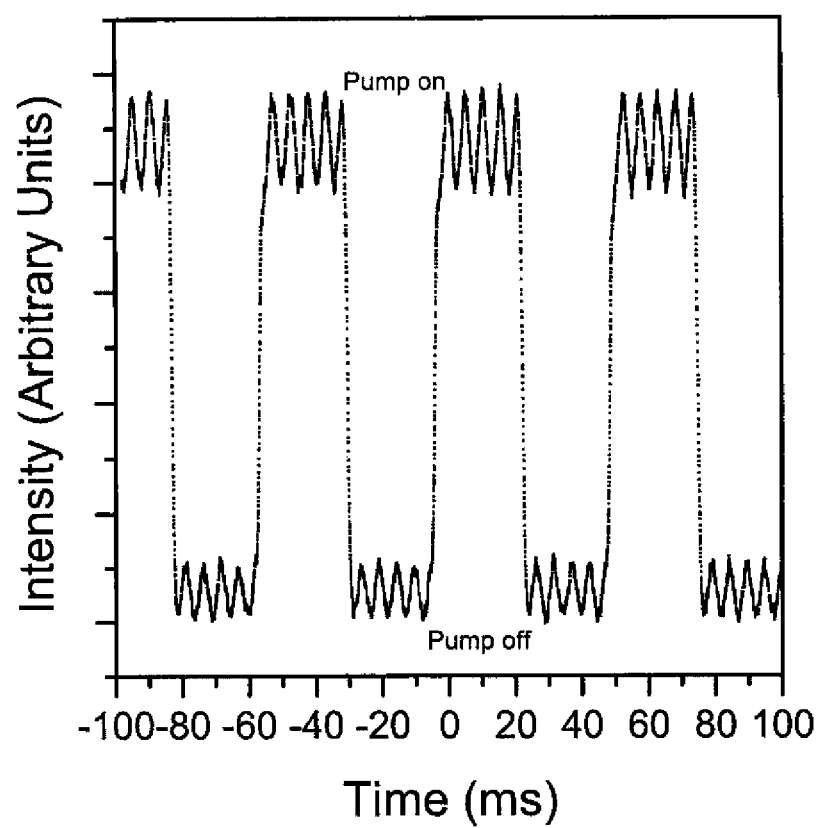

FIG. 10 shows the photoluminescence from the edge of the waveguide. The 190 Hz modulation can be seen to be amplified when the pump laser is on.

Figure 11:
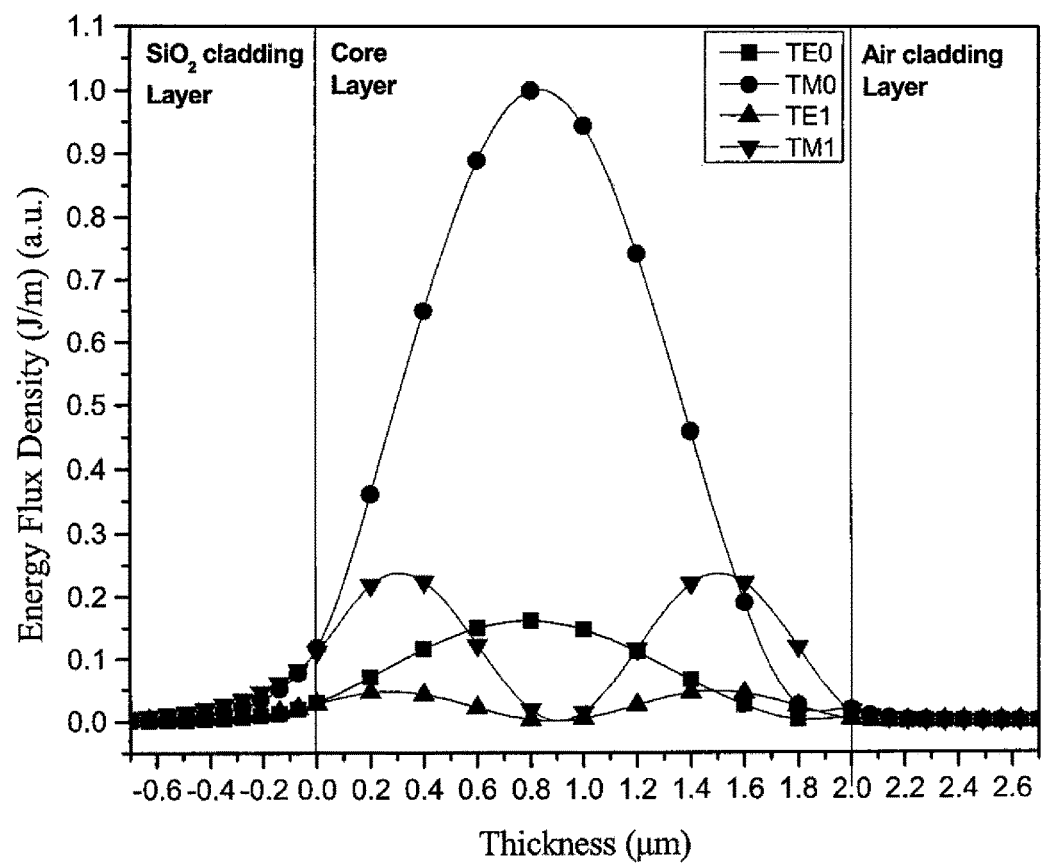

FIG. 11 shows energy flux density along the waveguide depth.

Figure 1:
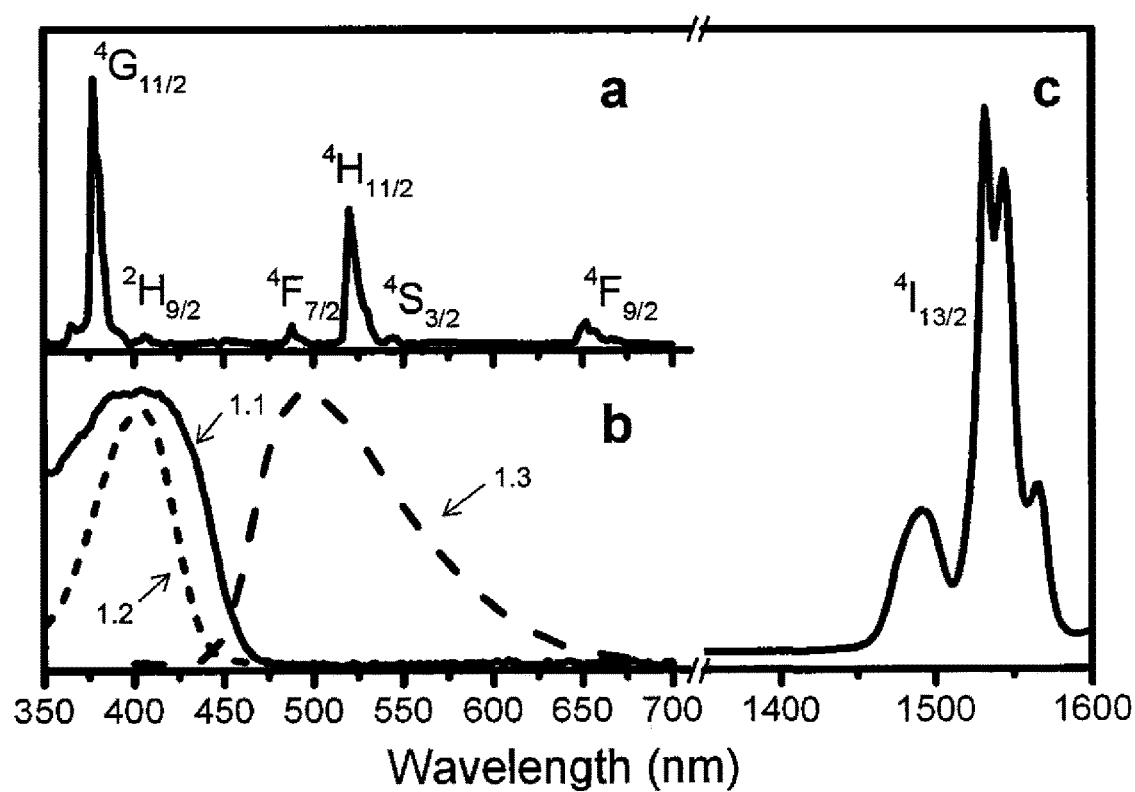
FIGS. 1a, 1b and 1c show optical spectra for certain organic materials

Referring now to the drawings, FIG. 1 shows optical spectra for the organic materials in accordance with a specific embodiment of the invention. FIG. 1(a) presents the absorption spectrum for a single crystal of $Er(F-TPIP)_3$ showing characteristic absorption into the $Er^{3+}$ transitions (all the transitions shown are from the $^4I_{15/2}$ ground state and labelled according to the excited state, using standard nomenclature). Of particular note, there is no ligand absorption in the visible region of the spectra. In FIG. 1(b), which shows the excitation spectrum of the doped film at an emission wavelength of 1.532 µm (black solid line) 1.1, direct excitation into the erbium ions was too weak to be recorded. The dotted line 1.2 is the absorption spectrum for a film of the chromophore $Zn(F-BTZ)_2$. The dashed line 1.3 is the photoluminescence spectrum for $Zn(F-BTZ)_2$ powder. FIG. 1(c) shows the infrared photoluminescence $^4I_{13/2} \rightarrow {}^4I_{15/2}$ from the erbium atoms in the doped film excited at a wavelength of 405 nm.

Figure 2:
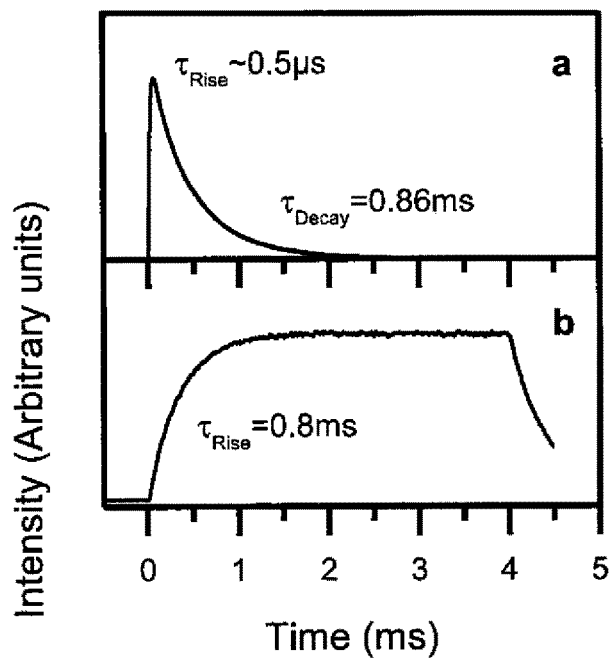
FIGS. 2a and 2b show the time dependence of erbium 1532 nm photoluminescence from a doped film

FIG. 2 shows the time dependence of the erbium 1532 nm photoluminescence from the doped film. In FIG. 2(a) it is excited using a 5 ns pulse at 417 nm excitation and in FIG. 2(b) it is excited using a square 4 ms pulse at 405 nm. The long rise time is due to the build-up in the triplet population in the chromophore which is the reservoir through which the erbium ions are excited. Also shown is the Jablonski diagram (FIG. 3) for the system highlighting the energy transfer from both the singlet $S_0$, $S_1$ and triplet states $T_1$ in the $Zn(F-BTZ)_2$. Dashed arrows 3.1 represent non-radiative decay.

Figure 4:
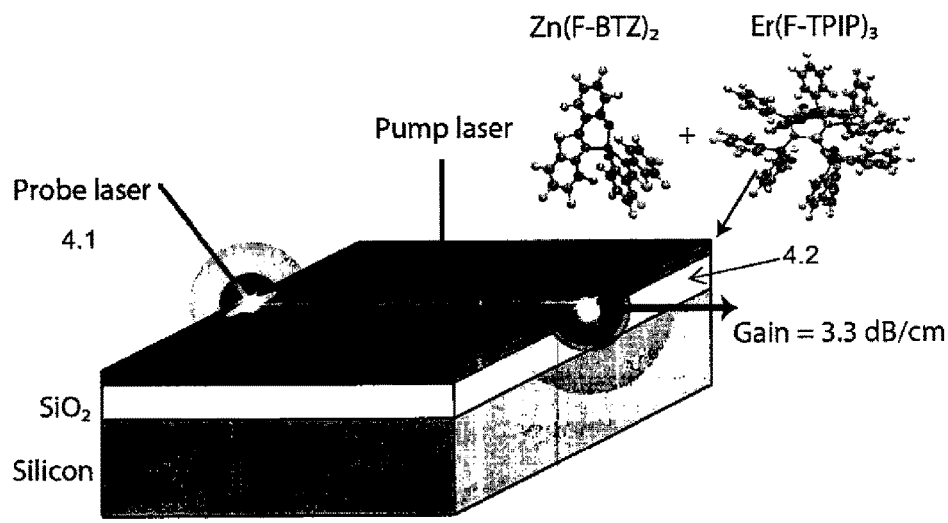
FIG. 4 is a schematic diagram of a waveguide structure used for gain measurements.

FIG. 4 is a schematic diagram of the waveguide structure used for the gain measurements. A probe laser 4.1 was used to excite photoluminescence in the waveguide which was measured at the opposite edge 4.2. The graph (FIG. 5) shows the intensity of the signal with 5.2 and without 5.1 a pump laser. The presence of the pump laser amplifies the signal intensity by ~100%.

Figure 6:
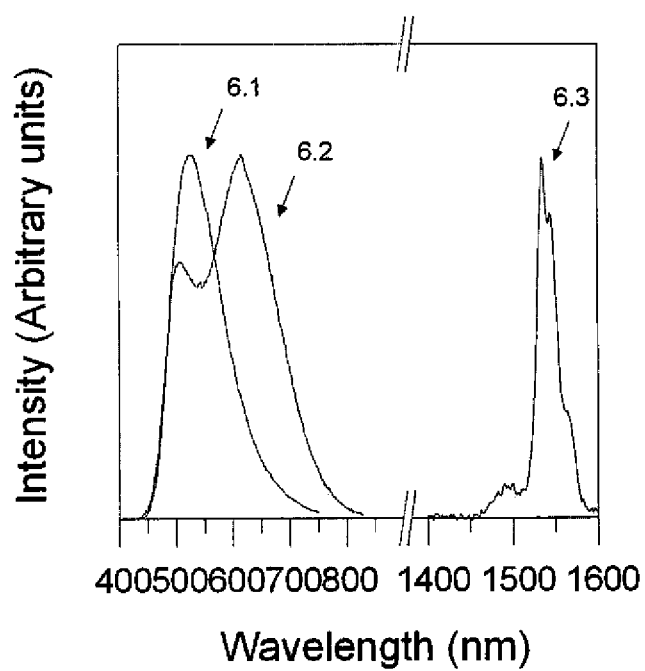
FIG. 6 shows the normalised electroluminescence from an organic light emitting diode (OLED) using a layer of pure $Zn(F-BTZ)_2$ and the corresponding electroluminescence from a doped device.

FIG. 6 shows the normalised electroluminescence from an organic light emitting diode (OLED) using a layer of pure $Zn(F-BTZ)_2$. Two peaks are observed 6.2: singlet emission at ~500 nm and triplet emission at ~610 nm. In the device where the $Zn(F-BTZ)_2$ is doped with 20% $Er(F-TPIP)_3$ the triplet emission can no longer be seen 6.1 and there is strong infrared luminescence from the erbium at ~1.532 µm 6.3.

In a preferred embodiment of the invention an erbium complex that does not demonstrate sensitisation in the visible region, but which provides a long luminescence lifetime for the encapsulated erbium ions, is co-evaporated with a halogenated organic chromophore.

In a specific embodiment of the invention the erbium complex is erbium(III) tetrakis(pentafluorophenyl)-imidodiphosphinate, $Er(F-TPIP)_3$ and the chromophore is a perfluorinated zinc-based organic chromophore, the zinc(II) salt of 2-(3,4,5,6-tetrafluoro-2-hydroxyphenyl)-4,5,6,7-tetrafluorobenzothiazole, $Zn(F-BTZ)_2$. This approach is vacuum compatible and high quality films may typically be grown on to any conventional substrate. We have used this approach to grow a 2 µm thick organic waveguide, on to a 700 nm thermally grown silicon dioxide layer on a silicon substrate. The resulting waveguide demonstrated a gain coefficient of 3.3 dB/cm at a wavelength of 1.532 µm, whilst optically pumped (5 mW) at a wavelength of 405 nm. Additionally, we have demonstrated that the active layer can be implemented into a 1.5 µm emitting organic light emitting diode (OLED). This technology may be used to produce organic optical amplifiers and lasers operating at the key telecommunications wavelength of 1.5 µm.

The absorption spectrum for a 100 µm crystal of $Er(F-TPIP)_3$ is presented in FIG. 1a; it can be seen that there is clear absorption directly into the $Er^{3+}$ ions but no evidence of ligand absorption at wavelengths greater than 350 nm. In contrast FIG. 1b shows the excitation spectrum, recorded at the $Er^{3+}$ emission wavelength of 1532 nm, for a 250 nm thick film of $Zn(F-BTZ)_2$, co-evaporated with 30% $Er(F-TPIP)_3$, Hence in this doped film there is no evidence of direct absorption into the $Er^{3+}$ ions and the excitation is dominated by a broad band which extends from the UV at <350 nm to ~475 nm in the blue. This excitation spectrum matches well to the emission from commercially available and highly efficient high-power blue light emitting diodes (LEDs).

As the excitation spectrum shows no evidence of direct absorption into the erbium ion we are only able to give a minimum value for the enhancement of sensitisation provided by the $Zn(F-BTZ)_2$ complex. The ratio of the size of the integrated area under the excitation spectrum from 350 nm to 500 nm to that measured in the region from 510 nm to 540 nm, which includes the strong 520 nm $^2H_{11/2} \rightarrow {}^4I_{15/2}$ transition, gives a minimum sensitisation for the doped film in the order of $10^4$, relative to direct absorption into the $Er^{3+}$ ion. In order to demonstrate that this sensitisation is directly attributable to the $Zn(F-BTZ)_2$ complex we show in FIG. 1b the absorption spectrum from a 250 nm thick layer of pure $Zn(F-BTZ)_2$. This absorption spectrum has a band that is coincident with that for the excitation spectrum of the doped layer, demonstrating that it is the Zn complex that sensitises the erbium emission. The infrared photoluminescence spectrum of the doped $Zn(F-BTZ)_2$ film when excited at a wavelength of 405 nm is shown in FIG. 1c. The emission spectrum shows strong luminescence from the $^4I_{13/2} \rightarrow {}^4I_{15/2}$ transition centred at ~1532 nm.

Crucial information on the nature of the sensitisation and energy transfer processes can be gained from time resolved measurements. Time resolved photoluminescence measurements at the erbium emission wavelength of 1532 nm (FIG. 2a) recorded using 5 ns pulses at a wavelength of 417 nm (near the peak of the excitation spectrum and away from any direct $Er^{3+}$ ion absorption) show a rise time of ~0.5 µs followed by a decay which has at least two components with an average lifetime of ~0.86 ms. The intrinsic radiative lifetime of $Er^{3+}$ ions, as derived from the corresponding $^4I_{15/2} \rightarrow {}^4I_{13/12}$ absorption spectrum using a single crystal of $Er(F-TPIP)_3$, is 13 ms for this transition indicating a quantum efficiency of ~7%. Such high photoluminescence efficiency, coupled with the high sensitisation, is critical for population inversion and thus gain.

Figure 3:
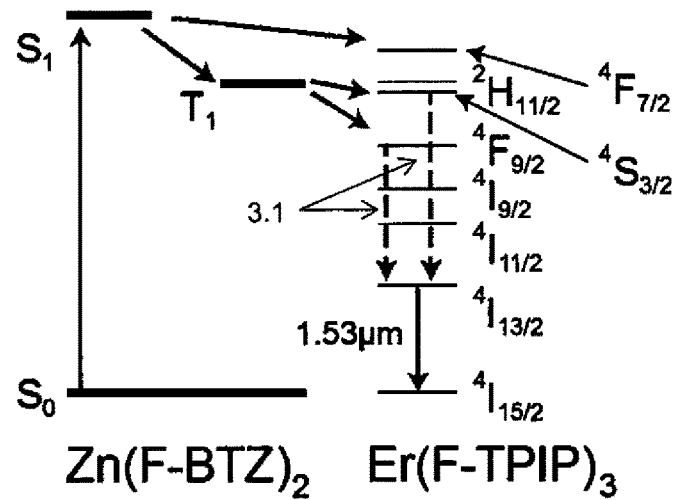
FIG. 3 is a Jablonski diagram showing energy transfer transitions in a preferred embodiment of the invention

We can describe the observed energy transfer processes from an organic chromophore into the $Er^{3+}$ ion in a Jablonski diagram (FIG. 3). Absorption of a photon in the organic moiety generates singlet excitons, $S_1$. A change in spin number is required to transfer the excitation from the organic $S_1$ state to the $Er^{3+}$ multiplets and that a prior change from the singlet into a lower lying triplet state, $T_1$ (intersystem crossing) allows this coupling to occur more efficiently. In this system the effect of the eight fluorine atoms on each benzothiazole ligand favours the spin mixing and intersystem crossing through the enhanced spin-orbit interaction caused by the high Z of fluorine and hence contributes to efficiently transferring the energy to the $Er^{3+}$ multiplets directly and via the intermediate state $T_1$.

The time evolution of the erbium 1532 nm emission when excited using square modulation of length 4 ms from a 405 nm laser, which again is only absorbed by the $Zn(F-BTZ)_2$ chromophore, is illustrated in FIG. 2b. Compared with the excitation using the 5 ns pulsed laser, the longer pulse gives a greatly increased rise time of 0.8 ms. This different behaviour can be explained if we consider that for the short pulse there is no time to build up a significant population in the triplet state and it is expected that the primary energy transfer into the $Er^{3+}$ ions will be through the short lived (<100 ns) singlet state in the $Zn(F-BTZ)_2$. The 0.5 µs rise time is therefore mainly contributed by the conversion of initially populated levels in the $Er^{3+}$ ions (arrow 21 in the Jablonski diagram of FIG. 3) into the emissive $^4I_{13/2}$ state. However, for the long excitation time the population in the triplet state of the $Zn(F-BTZ)_2$ increases with continuing excitation due to the long lifetime of the triplet state under optical excitation (~270 µs). The triplet therefore acts as a reservoir for transfer into the $Er^{3+}$ ions (arrows 22 in the Jablonski diagram).

Figure 5:
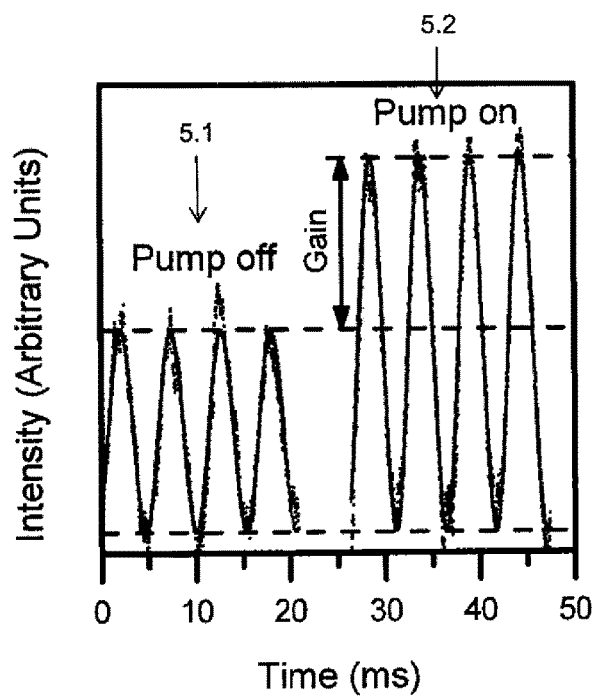
FIG. 5 is graph showing signal intensity measurements taken from the waveguide.

The sensitisation and luminescence properties of the $Zn(F-BTZ)_2$-$Er(F-TPIP)_3$ system make it an ideal candidate for use as an optical amplifier operating at telecommunications wavelengths. We have fabricated a waveguide formed from a 2 µm evaporated film of $Zn(F-BTZ)_2$ doped with 25% $Er(F-TPIP)_3$ on to a 700 nm thermally grown silicon dioxide layer on a silicon substrate. FIG. 5 shows the intensity of the 1.5 µm luminescence (modulated at 190 Hz) observed from the edge of the waveguide, with and without an optical pump. It can be clearly seen that the intensity of the modulated probe signal is amplified by ~100% when the pump laser is switched on. This gives a gain of 3.3 dB/cm at 1.532 µm in this waveguide structure.

While the optically pumped system which we have demonstrated can be widely utilised for optical gain as it is compatible with cheap, highly efficient, high-power LEDs further applications of this system are possible if the erbium ions are excited electrically. We have therefore demonstrated that $Er(F-TPIP)_3$ doped $Zn(F-BTZ)_2$ can be used to produce IR OLEDs. FIG. 6 shows the electroluminescence spectrum from a layer of pure $Zn(F-BTZ)_2$. Two peaks are clearly visible. The higher energy peak is due to the singlet state and has a short lifetime (<100 ns). The lower energy peak is due to the triplet state and has two lifetime components, a major one at ~50 µs and a smaller component at ~5 µs. These are somewhat lower than the 270 µs we have measured in a pulse photoluminescence experiment and can probably be attributed to quenching of the triplets in the OLED. One possible mechanism that is known to occur is triplet-polaron quenching, although there may be other mechanisms present such as triplet-triplet annihilation due to the much higher triplet population present in the OLED. The strong triplet emission observed in this device is evidence of the efficiency of the spin mixing between the singlet and triplet states due to the presence of the fluorine on the ligand. FIG. 6 also shows the 1.5 µm electroluminescence from an OLED where the $Zn(F-BTZ)_2$ was doped with 20% of $Er(F-TPIP)_3$ which demonstrates that efficient electrical pumping of this system is possible. In this doped OLED the visible emission is solely due to the singlet emission and this is probably caused by triplet quenching due to efficient coupling into the $Er^{3+}$ ions in the $Er(F-TPIP)_3$.

We have demonstrated a new system for producing high efficiency, sensitised infrared luminescence from erbium ions that is based on the separation of the absorption and emission functions and by having efficient energy transfer between them. This separation allows for much greater control over the individual functions which gives us fine control over the properties through design at a molecular scale. The approach is fully compatible with vacuum processing and can be deposited onto any substrate. We have used this approach to fabricate a simple planar waveguide on silicon and have demonstrated optical gain of 3.3 dB/cm at a wavelength of 1.532 µm, using a pump intensity of only 5 mW. We have also fabricated an OLED using the same active layer which demonstrates significant emissions from erbium. This approach makes possible new hybrid integrated optoelectronic devices and applications such as organic optical amplifiers and lasers which can be easily integrated into other materials systems.

Whilst we have specifically described certain preferred embodiments, it will be apparent to one skilled in the art that various modifications may be made without departing from the ambit of the invention. For example, there is a range of transition metal complexes using heavier ions than Zn (e.g. Ir and Pt) which have almost 100% transformation from singlet to triplet. These could be made using halogenated ligands. The signal translating device could be an optical splitter. In current splitters the signal intensity is reduced at each division therefore a 64 way splitter reduces the intensity at each output to 1/64th the input signal. If we made this out of our material then we would amplify the signal at the same time so that there would be no losses at all. Another variant would be multiplexers, where again gain to be integrated into the device instead of them being inherently lossy.

The invention may be applied to the fabrication of lasers. One embodiment could be a simple vertical cavity structure with a dielectric mirror at the bottom and a gold top mirror. The dielectric mirror would be transparent to the excitation wavelength but there may be lasing within the cavity. A second embodiment could use a distributed Bragg reflector either within a waveguide similar to that used by our prior optical amplifier or with a different period to get a vertical emission.

Signal translating devices could be integrated onto a single piece of silicon to produce optical integrated circuits.

An advantage which amplifiers produced in accordance with this invention have over conventional erbium doped fibre amplifiers is that a laser pump is no longer required to get high gain. A cheap energy source such as an indium gallium nitride diode may be used or it may be energised using an organic light emitting diode.

In another embodiment a silicon substrate with a silicon dioxide surface layer is masked to form a spiral structure, the silicon dioxide is etched away to leave a ridge of silicon dioxide and then the organic layer is evaporated to form the waveguide and that will have a gain which may be of the order of 20 dB.

Figure 7:
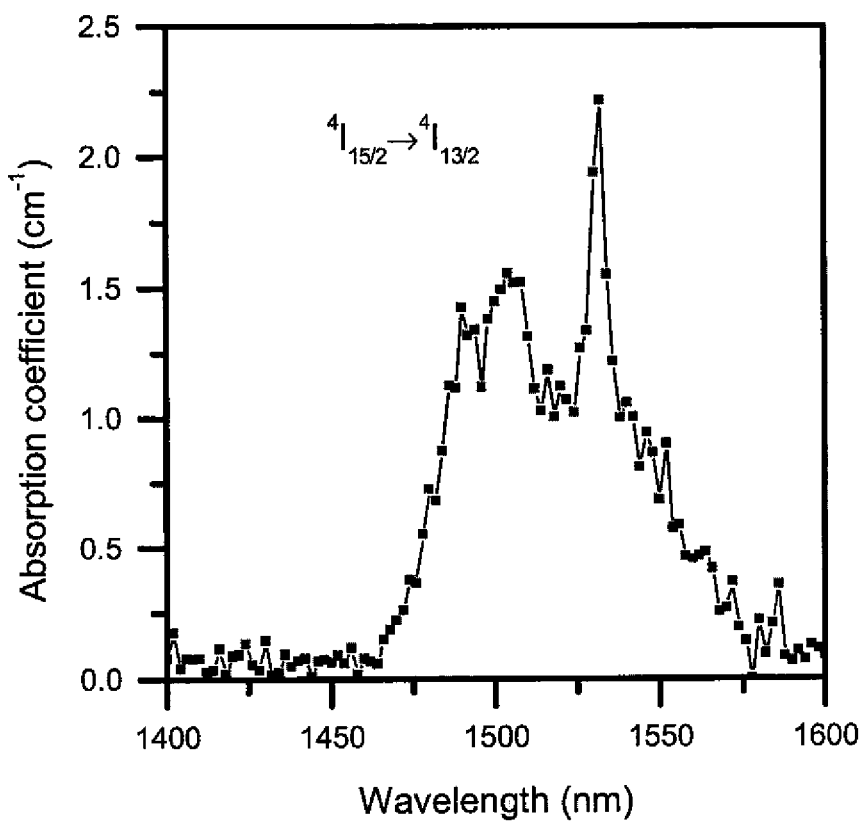
FIG. 7 shows the absorption spectrum between 1400 nm and 1600 nm of a $Er(F-TPIP)_3$ crystal.

Supplementary Information
Brief Description of the Figures Relating to the Supplementary Information FIG. 7 shows the absorption spectrum between 1400 nm and 1600 nm of a Er(F-TPIP)$_3$ crystal.

FIG. 8 shows the photoluminescence decay of the triplet emission in Zn(F-BTZ)$_2$.

FIG. 9 shows the delayed ($\Delta t$=50 μs) photoluminescence emission of Zn(F-BTZ)$_2$. The spectrum shows the triplet emission, which matches the broad low energy band observed in electroluminescence (see main text).

FIG. 10 shows the photoluminescence from the edge of the waveguide. The 190 Hz modulation can be seen to be amplified when the pump laser is on.

FIG. 11 shows energy flux density along the waveguide depth.

Materials and Methods

Following synthesis both Er(F-TPIP)$_3$ and Zn(F-BTZ)$_2$ were purified by train sublimation under $10^{-7}$ mbar vacuum prior to use.

Crystallization and Crystal Absorption Measurement

The purified Er(F-TPIP)$_3$ powder was dissolved in >99.5% Dimethyl Sulfoxide (DMSO) (Sigma-Aldrich). Pink crystals precipitated at room temperature after slow solvent evaporation for a week and were then filtered off. Single crystal X-ray diffraction studies were performed on the same crystal that was used for absorption spectrum. Structures were solved and refined using the Bruker SHELXTL Software Package.

Absorption spectra on the crystal were obtained via a home-made single-beam micro-absorption setup with a randomly oriented crystal flatly deposited on a quartz substrate and focused by corresponding Cassegrain and Mitutoyo glass objectives. Absorption spectrum from 1400 nm-1600 nm were taken using a tungsten lamp and a Triax 550 monochromator equipped with 600 lines/mm gratings. Light detection was using a Hamamatsu R5509-72 liquid nitrogen-cooled detector. Signals were measured using a 7265 DSP Perkin Elmer lock-in amplifier and recorded with the resolution of 2 nm (FIG. 7). The Becke line test with calibrated liquids (Cargille) was employed to estimate an averaged value for the refractive index of microcrystals. The crystal thicknesses were measured by a graduated microscope equipped with a micropositioning stage (accuracy=5 μm).

Calculation for the Radiative Lifetime of 1.5 μm and Photoluminescence Efficiency The line strengths S(J→J') of specific electronic transitions of Er$^{3+}$ ions are determined using the following expression:

$$S_{meas}(J \to J') = \frac{3ch(2J+1)n}{8\pi^3 \bar{\lambda} e^2} \left[ \frac{9}{(n^2+2)^2} \right] \Gamma$$

where $\bar{\lambda}$ is the mean wavelength of special absorption bands. J' and J are the quantum numbers of total angular momentum of the initial state and the excited state, respectively and n is the refractive index of the host material. The average refractive index of the crystal employed in measurement of absorption spectra was measured to be 1.65 by Becke line test. Γ is the integrated absorption coefficient, $\Gamma = \int \in(\lambda)d\lambda$, where $\in$ is the absorption coefficient which we determine from the absorption spectra by $\in=A/(NL)$. A denotes the integrated area of absorption band, N is the Er$^{3+}$ concentration and L is the thickness of the sample. The factor $[9/(n2+2)_2]$ represents the local field correction of electric dipole transition.

Measured line strengths provide the radiative decay coefficient corresponding to each transition:

$$A(J' \leftrightarrow J) = \frac{64\pi^4 e^3}{3h(2J+1)\bar{\lambda}^3} \left[ \frac{n(n^2+2)^2}{9} \right] S_{meas}(J \to J')$$

The radiative lifetime $\tau_r^{1.5\mu m}$ of the $^4I_{13/2} \to {}^4I_{15/2}$ transition is obtained from absorption spectrum:

$\tau_r^{1.5\mu m} = A^{-1}({}^4I_{13/2} \to {}^4I_{15/2})$

The absorption spectrum from 1400-1600 nm is extracted with the resolution of 2 nm in FIG. 7.

Delayed Spectroscopy and Triplet Lifetime Measurement

The measurement of the delayed spectrum and triplet lifetime in Zn(F-BTZ)$_2$ films was performed by exciting at 430 nm with an OPO (Vibrant II, Opotek) and detecting with an iCCD S20 Gen II Horiba Jobin-Yvon intensified CCD. The light was dispersed with a TRIAX320 monochromator.

The lifetime was measured by integrating the 40 times averaged emission centered at 685 nm with a changing delay of 50-850 μs and counting for 1100 μs (FIG. 8). FIG. 9 shows the delayed luminescence spectrum.

The Growth of Er(F-TPIP)$_3$ Co-Doped Zn(F-BTZ)$_2$ Film Via Co-Evaporation

Doped films were grown by co-evaporation at a base pressure of ~$10^{-7}$ mBar. Evaporation rates were independently controlled using two quartz crystal film thickness monitors. Evaporation rates were controlled so that the total deposition rate was at most 0.2 nm/s. Evaporation rates were initially calibrated using film thickness measurements using a Dektak 3. The calibration of molecule ratio in co-doped film was confirmed using energy dispersive x-ray analysis (EDX) on a FEI Quanta 3D ESEM.

Photoluminescence of 30% Doped Er(F-TPIP)$_3$ in Zn(F-BTZ)$_2$ Co-Doped Film

For the nanosecond pulsed photoluminescence (PL) experiments excitation was from a Continuum Panther Optical Parametric Oscillator (OPO) laser pumped by a Continuum Surelite (SLI-10) Nd:YAG. The laser pulse is 5 ns.

For the millisecond pulsed measurements a 405 nm laser was modulated with a TTL signal to give 4 ms pulses with a rise/decay time of <20 ns.

Luminescence was focused and filtered onto the adjustable entrance slits of the Jobin Yvon Horiba Triax 550 spectrometer and detected using Hamamatsu R5509-72 liquid nitrogen-cooled detector.

Excitation spectra were obtained by using a homemade continuous monochromic system. A xenon lamp was filtered and focused into a Jobin-Yvon Horiba Triax 180 spectrometer equipped with 1200 lines/mm gratings. The monochromatic light from the output of Triax 180 was focused into the co-doped film as ~1 mm light spot. The illumination intensity on the sample was measured directly by a calibrated Newport 918D-UV-OD3R silicon photodetector to normalise the excitation spectra for variations in illumination intensity. The luminescence of 1.532 µm was focused into a Jobin-Yvon Horiba Triax 550 equipped with 600 lines/mm gratings. 1.532 µm luminescence was detected using a Hamamatsu R5509-72 nitrogen-cooled detector and measured using a 7265 DSP Perkin Elmer lock-in amplifier.

Waveguide Fabrication and Measurement

The waveguide was deposited on a 700 nm thermally grown silicon dioxide layer on a silicon substrate.

The refractive index of co-doped film was measured via the Jobin Yvon ellipsometer and fitted using a Lorentz oscillator model. The refractive index of co-doped film at 1.5 µm is 1.65 compared to 1.44 for the silicon dioxide layer.

The silicon substrate was cut to a 20×20 mm² square and a 2 µm of 30% Er(F-TPIP)$_3$ co-doped Zn(F-BTZ)$_2$ layer was deposited onto a 10×10 mm² area in the center. The concentration of erbium ions in the waveguide is ~1.8×10$^{20}$ cm$^{-3}$. The silicon substrate was then cleaved through the organic layer to give an abrupt edge to the waveguide which was of length 8 mm.

The probe laser, at a wavelength of 405 nm and a power of ~5 mW, was modulated at 190 Hz and focused into the circle of ~400 µm on one edge of the organic layer. The pump laser, also at 405 nm but with an initial power of 5 mW, was modulated at 19 Hz and synced to the probe laser. This beam was expanded to a diameter of ~2 cm and then focused using a cylindrical lens to a ~320 µm wide and 0.8 cm long stripe which overlapped the probe beam. We estimate the pump power on the stripe to be ~3 mW.

The light from the cleaved edge of waveguide was focused and filtered onto the adjustable entrance slits of the Jobin Yvon Horiba Triax 550 spectrometer and collected by Hamamatsu R5509-72 nitrogen-cooled detector. The measured signal can be seen in FIG. 10. The 190 Hz probe luminescence can be seen superimposed onto the 19 Hz pump luminescence. The difference in the intensity of the probe beam, with and without the pump, can be used to calculate the absolute optical gain. To determine the internal net gain we have to remove the losses within the waveguide. These losses are primarily due to absorption by the Er(F-TPIP)$_3$. FIG. 7 gives the absorption spectra for this material and given that our layer is doped with 30% Er(F-TPIP)$_3$ we have taken 0.3 of the absolute absorption to calculate a minimum internal net gain of at least 1.0 dB/cm. The gain was determined by taking an average of 4 measurements.

Propagation Modes and Wave Field in Asymmetrical Planar Dielectric Waveguides

Our waveguide is a simple asymmetric slab waveguide with a 2 µm organic core layer of refractive index, $n_1$, a 700 nm silicon dioxide lower cladding layer of refractive index, $n_2$, and air as the upper cladding layer of refractive index, $n_3$, with an interface 13 between upper cladding layer (air) and core, and an interface 12 between core and the lower cladding layer (silicon dioxide). The propagation behavior of this planar waveguide can be modeled using a simple ray-optical approach (reference 1).

Snell's law states that $$n_1 \sin\theta_1 = n_2 \sin\theta_2 = n_3 \sin\theta_3$$

Where θ1, θ2 and θ3 are the angle of reflection at 12, the angle of refraction at 12 and the angle of refraction at 13, respectively. The phase coefficients in the core, lower and upper cladding layers are $\gamma_1$, $\gamma_2$ and $\gamma_3$, where $\gamma_1 = k_0(n_1^2 - n_{\mathit{eff}}^2)^{1/2}$, $\gamma_2 = k_0(n_{\mathit{eff}}^2 - n_2^2)^{1/2}$ and) $\gamma_3 = k_0(n_{\mathit{eff}}^2 - n_3)^{1/2}$ and the effective refractive index of propagation is $n_{\mathit{eff}} = n_1 \sin\theta_1$.

In the case that $n_1 > n_2 > n_3$, the situation of total internal reflection at both interfaces will cause the phase shift $-2\phi_{12}$ and $-2\phi_{13}$ (reference 2, reference 3), where at interface 12, $$2\Phi_{12} = 2\arctan[(n_1^2 \sin^2\theta_1 - n_2^2)/n_1\cos\theta_1]^{1/2} = 2\arctan\left(\frac{\gamma_2}{\gamma_1}\right)$$

And for interface 13, $$2\Phi_{13} = 2\arctan[(n_1^2 \sin^2\theta_1 - n_3^2)/n_3\cos\theta_1]^{1/2} = 2\arctan\left(\frac{\gamma_3}{\gamma_1}\right)$$

We can simplify the phase shifts by defining $T_2 = \gamma_2/\gamma_1$ and $T_3 = \gamma_3/\gamma_1$ giving $2\Phi_{12} = 2\arctan T_2$ and $-2\Phi_{13} = -2\arctan T_3$.

The eigenvalue function or dispersion relationship is used to define the distribution of the propagation modes in the waveguide structure. The total phase shift, which happens both in interface 12 and interface 13 satisfies $2\gamma_1 b - 2\Phi_{12} - 2\Phi_{13} = 2m\pi$, so the eigenvalue function (reference 4) is, $$\gamma_1 b = m\pi + \arctan T_2 + \arctan T_3$$

Here, $T_2$ and $T_3$ are modified to separate expressions for TE and TM. s=0 for TE mode and s=1 for TM, respectively.

$$T_2 = \left(\frac{n_1^2}{n_2^2}\right)^s \frac{\gamma_2}{\gamma_1},$$

$$T_3 = \left(\frac{n_1^2}{n_3^2}\right)^s \frac{\gamma_3}{\gamma_1}$$

In general, the normalized parameters P, V and Q are employed to generalize the eigenvalue function. P is the normalized propagation constant, V is the normalized core thickness and Q is the asymmetry factor:

$$P = \frac{\beta^2 - k_0^2 n_2^2}{k_0^2(n_1^2 - n_2^2)},$$

$$V = k_0(n_1^2 - n_2^2)^{1/2} b,$$

$$Q = \left(\frac{n_1^2 - n_3^2}{n_1^2 - n_2^2}\right)$$

The normalized eigenvalue function is:

$$(1-P)^{1/2} V = m\pi + \arctan\left(\frac{P}{1-P}\right)^{1/2} + \arctan\left(\frac{P+Q}{1-P}\right)^{1/2}$$

β is the propagation constant along the waveguide. The penetration depth in the cladding layers are defined as $\Delta\chi = \Delta z/\tan\theta_1$, where $\Delta z$ is the displacement at the interface due to the phase shift (reference 3, reference 5). Therefore, $\Delta z$ is given by $\Delta z = d\phi/d\beta$. Using these expressions, the penetration depth in the two cladding layers 3 and 2, and the effective thickness of wave-guide core can be obtained for the TE and TM modes. For the TE mode:

$$\Delta x_{2TE} = \frac{1}{\gamma_2},$$

$$\Delta x_{3TE} = \frac{1}{\gamma_3},$$

$$b_{effTE} = b + \Delta x_{2TE} + \Delta x_{3TE}$$

For the TM mode:

$$\Delta x_{2TM} = \frac{n_1^2 n_2^2 (\gamma_1^2 - \gamma_2^2)}{\gamma_2 (n_2^4 \gamma_1^2 + n_1^4 \gamma_2^2)},$$

$$\Delta x_{3TM} = \frac{n_1^2 n_3^2 (\gamma_1^2 - \gamma_3^2)}{\gamma_3 (n_3^4 \gamma_1^2 + n_1^4 \gamma_3^2)},$$

$$b_{effTM} = b + \Delta x_{2TM} + \Delta x_{3TM}$$

In our planar waveguide at a wavelength of 1.5 μm, $n_1$ of the organic core layer is 1.65, $n_2$ of the thermally grown $SiO_2$ is 1.44 and $n_3$ of air is 1. The thickness, b, of the core layer is 2 μm. The thickness of $SiO_2$ cladding layer is 700 nm. Numerical calculation shows that TE0, TM0, TE1 and TM1 modes exist in the waveguide structure. The propagation constants of each mode can be obtained through numerical solutions of eigenvalue function. The propagation constant, effective index, penetration depth and effective waveguide thickness of each guide mode are listed in the Table 1.

TABLE 1

Propagation constant, effective index, penetration depth and effective waveguide thickness

| Mode | Propagation Constant β | Effective Refractive Index $N = \beta/k_0$ | Penetration Depth (Substrate) $\Delta x_2$ | Attenuation Coefficient α | Effective Core Thickness $b_{eff}$ |
|---|---|---|---|---|---|
| TE0 | $6.761(10^6)$ | 1.614 | 328 nm | 54.842 | 2.6 μm |
| TE1 | $6.414(10^6)$ | 1.531 | 459 nm | 64.020 | 2.7 μm |
| TM0 | $6.755(10^6)$ | 1.613 | 272 nm | 65.592 | 2.4 μm |
| TM1 | $6.391(10^6)$ | 1.526 | 485 nm | 61.692 | 2.7 μm |

Any doped erbium medium would have weak ab+-sorption of 1.5 μm, which would cause absorption loss. The attenuation loss yields a complex propagation constant in an absorbing medium, $\tilde{\beta} = \beta - i\alpha$ where α is attenuation coefficient of the amplitude of the propagation mode. Considering that $\tilde{\beta}$ is complex, the calculation is non-trivial and therefore a perturbation method is generally used to estimate the attenuation coefficient corresponding to the structure and propagation parameters that are estimated with non-loss conditions (reference 6, reference 7). The first-order perturbation calculation of the Helmholtz equation gives the general expressions of attenuation coefficients for the TE and TM modes, where we define the attenuation coefficients $\alpha_1$, $\alpha_2$ and $\alpha_3$ in core layer, substrate layer and cladding layer, respectively:

$$\alpha_{TE} = \frac{1}{Nb_{eff}}\left[n_1\alpha_1\left(b + \frac{\gamma_2}{\gamma_1^2+\gamma_2^2} + \frac{\gamma_3}{\gamma_1^2+\gamma_3^2}\right) + \frac{n_2\alpha_2\gamma_1^2}{\gamma_2(\gamma_1^2+\gamma_2^2)} + \frac{n_3\alpha_3\gamma_1^2}{\gamma_3(\gamma_1^2+\gamma_3^2)}\right]$$

$$\alpha_{TM} = \frac{1}{Nb_{eff}}\left[n_1\alpha_1\left(b + \frac{n_1^2 n_2^2 \gamma_2}{n_2^4\gamma_1^2+n_1^4\gamma_2^2} + \frac{n_1^2 n_3^2 \gamma_3}{n_3^4\gamma_1^2+n_1^4\gamma_3^2}\right) + \right.$$
$$\left. n_2\alpha_2 \frac{n_1^2 n_2^2 \gamma_1^2}{\gamma_2(n_2^4\gamma_1^2+n_1^4\gamma_2^2)} + n_3\alpha_3 \frac{n_1^2 n_3^2 \gamma_1^2}{\gamma_3(n_3^4\gamma_1^2+n_1^4\gamma_3^2)}\right]$$

The attenuation coefficient for each TE and TM are also listed in Table 1. The attenuation coefficient of core-layer is determined from absorption coefficient of erbium ions at 1.5 μm in co-doped core layer, $\alpha_1$=0.66 cm$^{-1}$. The attenuation coefficients of the silicon dioxide layer, $\alpha_2$, and air, $\alpha_3$, are taken as zero.

Obviously, the attenuation coefficient is only $10^5$ less than propagation constant in the waveguide so that the attenuation coefficient makes some difference to the propagation constant and electromagnetic distribution in the waveguide.

Wave Distribution

The distribution fields for TE and TM modes as expressed:

$$\frac{E_y(x)}{H_y(x)} =$$

$$\begin{cases} A\exp(\gamma_2 x) & (-\infty < x \le 0: \text{substrate}) \\ A[\cos(\gamma_1 x) + T_2\sin(\gamma_1 x)] & (0 \le x \le b: \text{core}) \\ A[\cos(\gamma_2 b) + T_2\sin(\gamma_2 b)]\exp[-\gamma_3(x-b)] & (b \le x \le +\infty: \text{cladding}) \end{cases}$$

Similar expressions are suitable for $E_y(\chi)$ of TE mode and $H_y(\chi)$ of TM mode. Energy flux density can be obtained using the Poynting rule:

For TE mode $\vec{S} = \frac{\beta}{2\omega\mu_0}E_y(x)\Big|^2 \vec{z}$;

For TM mode: $\vec{S} = \frac{\beta}{2\omega\varepsilon_0\varepsilon_1}|H_y(x)^2\vec{z}$ The energy flux density along the waveguide depth is plotted in FIG. 11. The waveguide depth is defined as 0 μm at the interface between organic core and $SiO_2$ substrate, and the waveguide depth at 2 μm is the interface between organic core and cladding layer of air. It can therefore be calculated that 96% of the light is propagating in the organic core.

OLED Fabrication

All the layers were deposited in a high-vacuum ($10^{-8}$ mbar) Kurt J. Lesker thermal evaporation system onto a clean patterned ITO substrate. The thickness of each layer was measured by an in-situ quartz crystal monitor. 3,3'-dimethyl-N$^4$,N$^4$,N$^{4'}$,N$^{4'}$-tetra-m-tolyl-[1,1'-biphenyl]-4,4'-diamine (HMTPD) (50 nm) was used as the hole injection and transport layer. The emissive layer (EML) was a film of Zn(F-BTZ)$_2$ (20 nm) for the undoped device, or the same thickness film of Zn(F-BTZ)$_2$ co-evaporated with 20% Er(F-TPIP)$_3$ for the codoped device. A 50 nm thickness film of aluminum 8-hydroxyquinolinate (Alq$_3$) was used as an electron transport layer (ETL). The cathode consisted of 1 nm LiF with 100 nm of aluminum.

REFERENCES

1. H. Kogelnik: Theory of dielectric waveguides, in Integrated Optics, T. Tamir (ed.), 2$^{nd}$ edn., Topics Appl. Phys., Vol. 7 (Springer, Berlin, Heidelberg 1979) Chap. 2

2. M. Born, E. Wolf: Principles of Optics, 3$^{rd}$ edn. (Pergamon, N.Y. 1970) p. 49
3. K. Artmann, Ann. Physik, 1948, 2, 87.
4. H. K. V. Lotsch, Optik, 32, 116, 189, 299, 553, (1970).
5. K. Zhang, D. Li, et al, Electromagnetic theory for microwaves and optoelectronics Second Edition, p. 344, 1998
6. J. Kane and H. J. Osterberg, Opt. Soc. Am., 1964, 54, 347
7. A. Reisinger, Appl. Opt., 1973, 12, 1015

The invention claimed is:

1. An optoelectronic signal translating device having a region including an organic complex containing rare earth or transition metal ions with permitted upper and lower energy states for generation of radiation of a predetermined wavelength by means of a transition between said energy states, wherein said organic complex further comprising a halogenated ligand adapted to enhance the emission of radiation by conservation of ions in said upper energy state, and a fully halogenated chromophore separately co-operable with a radiation source of wavelength not greater than that of said predetermined desired radiation to excite said chromophore to cross-couple with either the upper permitted energy state or to a higher energy state of said rare earth or transition metal ions from which said ions decay to said upper permitted state thereby to generate said predetermined desired radiation by the subsequent decay of said ions to the permitted lower energy state.

2. An optoelectronic signal translating device according to claim 1 wherein said chromophore uses a phosphorescent material for mixing of singlet and triplet states to enhance the triplet population.

3. An optoelectronic signal translating device according to claim 1 wherein said organic complex comprises a fluorinated ligand to enhance the emission of radiation by conservation of ions in said upper energy state.

4. An optoelectronic signal translating device according to claim 1 wherein said organic complex comprises a chlorinated ligand to enhance the emission of radiation by conservation of ions in said upper energy state.

5. An optoelectronic signal translating device according to claim 1 wherein the chromophore is fluorinated.

6. An optoelectronic signal translating device according to claim 1 wherein the chromophore is chlorinated.

7. An optoelectronic signal translating device according to claim 1 wherein said organic complex is erbium(III) tetrakis(pentafluorophenyl)-imidodiphosphinate, Er(F-TPIP)$_3$ and said chromophore is the zinc(II) salt of 2-(3,4,5,6-tetrafluoro-2-hydroxyphenyl)-4,5,6,7-tetrafluorobenzothiazole, Zn(F-BTZ)$_2$.

8. A method of fabricating an optoelectronic device comprising the step of co-depositing an organic complex of a rare earth or transition metal element which has a relatively long fluorescence lifetime, said organic complex comprising a halogenated ligand to enhance the emission of radiation by conservation of ions in said upper energy state, said organic complex deposited together with a fully halogenated chromophore which does not demonstrate sensitisation at a wavelength on the vicinity of that of the fluorescence of said organic complex wherein said fully halogenated chromophore can transfer energy absorbed from a radiation source to said organic complex to excite it to generate radiation at a desired predetermined wavelength characteristic of said organic complex to enhance the emission of radiation by conservation of ions in said upper energy state.

9. A method of fabricating an optoelectronic signal translating device according to claim 8 wherein said organic complex comprises a fluorinated ligand or a chlorinated ligand.

10. A method of fabricating an optoelectronic signal translating device according to claim 8 wherein said chromophore is fluorinated or chlorinated.

11. A method of fabricating an optoelectronic device according to claim 9 wherein said organic complex is erbium(III) tetrakis(pentafluorophenyl)-imidodiphosphinate, Er(F-TPIP)$_3$ and said chromophore is the zinc(II) salt of 2-(3,4,5,6-tetrafluoro-2-hydroxyphenyl)-4,5,6,7-tetrafluorobenzothiazole, Zn(F-BTZ)$_2$.

12. An optically active material comprising rare earth or transition metal ions with permitted upper and lower energy states for generation of radiation of a predetermined wavelength by means of a transition between said energy states, an organic complex comprising a halogenated ligand adapted to enhance the emission of radiation by conservation of said ions in said upper energy state and a fully halogenated chromophore separately co-operable with a radiation source of wavelength not greater than that of said predetermined desired radiation to excite said fully halogenated chromophore to cross-couple with either the upper permitted energy state or to a higher energy state of said rare earth or transition metal ions from which said ions decay to said upper permitted state thereby to generate said predetermined desired radiation by the subsequent decay of said ions to the permitted lower energy state.

13. An optically active material according to claim 12 wherein said chromophore uses a phosphorescent material for mixing of singlet and triplet states to enhance the triplet population.

14. An optically active material according to claim 12 wherein said organic complex comprises a fluorinated ligand or a chlorinated ligand.

15. An optically active material according to claim 12 wherein said chromophore is fluorinated or chlorinated.

16. An optically active material according to claim 12 wherein the organic complex is erbium(III) tetrakis(pentafluorophenyl)-imidodiphosphinate, Er(F-TPIP)$_3$ and said chromophore is the zinc(II) salt of 2-(3,4,5,6-tetrafluoro-2-hydroxyphenyl)-4,5,6,7-tetrafluorobenzothiazole, Zn(F-BTZ)$_2$.

* * * * *